United States Patent [19]

Mizoguchi et al.

[11] Patent Number: 5,894,236
[45] Date of Patent: Apr. 13, 1999

[54] OUTPUT CIRCUIT WITH INCREASED OUTPUT CURRENT

[75] Inventors: Satoshi Mizoguchi, Yokohama; Kumiko Iwasaki, Ota-ku, both of Japan

[73] Assignee: Kabushiki Kaisha Toshiba, Kawasaki, Japan

[21] Appl. No.: 08/773,536

[22] Filed: Dec. 23, 1996

[30] Foreign Application Priority Data

Dec. 21, 1995 [JP] Japan ................................ 7-333794
Dec. 12, 1996 [JP] Japan ................................ 8-332268

[51] Int. Cl.[6] ............................... G06F 3/26; H03F 3/45
[52] U.S. Cl. ..................... 327/108; 327/562; 327/437; 327/543; 326/83; 330/255; 330/264; 323/315
[58] Field of Search .......................... 330/255, 257, 330/264, 267; 327/52, 53, 112, 562, 389, 391, 546, 362, 434, 437, 427, 538, 541, 543, 108; 326/82, 83; 323/315

[56] References Cited

U.S. PATENT DOCUMENTS

| | | | |
|---|---|---|---|
| 4,736,117 | 4/1988 | Wieser | 327/541 |
| 4,893,090 | 1/1990 | Boudewijns | 330/253 |
| 5,057,789 | 10/1991 | Nagaraj | 330/264 |
| 5,113,148 | 5/1992 | Theus | 330/253 |
| 5,444,413 | 8/1995 | Kimura et al. | 327/562 |
| 5,469,080 | 11/1995 | Son | 326/83 |
| 5,515,006 | 5/1996 | Chan | 330/264 |

*Primary Examiner*—Timothy P. Callahan
*Assistant Examiner*—Terry L. Englund
*Attorney, Agent, or Firm*—Oblon, Spivak, McClelland, Maier & Neustadt, P.C.

[57] ABSTRACT

An output circuit includes: a constant voltage source; a first transistor of a first-conductivity type having a gate connected to the constant voltage source; a second transistor of a second-conductivity type that is opposite to the first conductivity type, having a source connected to a source of the first transistor and a gate connected to a circuit input terminal; a third transistor of the first-conductivity type having a drain connected to a circuit output terminal and a gate connected to the circuit input terminal; a current-current converter circuit for outputting current proportional to drain current of the second transistor to the circuit output terminal; and a voltage supply for supplying an output voltage to and operating the first to third transistors and the current-current converter circuit. Here, an output current of the current-current converter circuit and a drain current of the third transistor can be determined according to the output voltage of the constant voltage source in a steady state.

10 Claims, 10 Drawing Sheets

OUTPUT CIRCUIT WITH INCREASED OUTPUT CURRENT

BACKGROUND OF THE INVENTION

1. Field of the Invention

The present invention relates to an output circuit for a semiconductor device, and more specifically to an output circuit suitable for use as an output stage of an operational amplifier.

2. Description of the Prior Art

Figure 1:
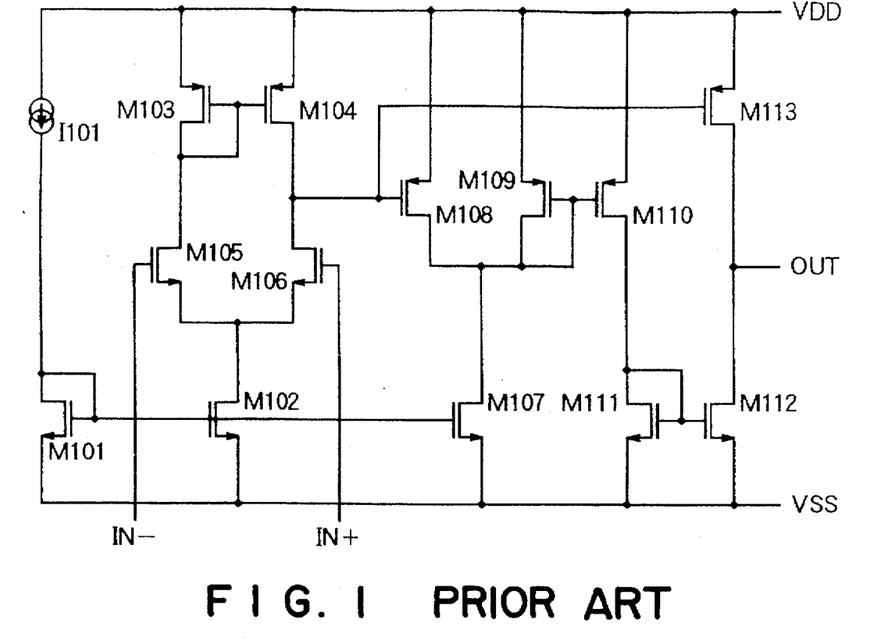
FIG. 1 is a circuit diagram showing a conventional operational amplifier.

Conventional operational amplifiers will be described hereinbelow with reference to the attached drawings. FIG. 1 shows a conventional operational amplifier disclosed in Japanese Patent Laid-Open No. 1(1989)-318414. In FIG. 1, a constant current source I101 and three transistors M101, M102 and M107 form a current mirror circuit that supplies a constant current to an input and output amplifier stages. Two MOS transistors M105 and M106 construct a differential amplifier. Two input signals IN− and IN+ whose voltage levels change complementarily are input to the gates of the MOS transistors M105 and M106, respectively. The differential amplifier generates an output signal at its output terminal, or a drain of a transistor M104. The voltage at the output terminal is amplified by an output circuit provided with MOS transistors M107 to M113, and is then output to an output terminal OUT.

In the circuit as described above, an output sink current from a load (not shown) connected to the circuit flows as a drain current of the transistor M112. Here, the transistor M112 and the transistor M109 are connected to each other through a current mirror circuit of the transistors M112 and M111 and another mirror circuit of the transistors M109 and M110. The drain current of the transistor M112 is thus proportional to that of the transistor M109. The maximum drain current of the transistor M109 is the drain current of the transistor M107 operating as a current source. Further, the drain current of this transistor M107 is proportional to the output current of the constant current source I101 flowing through the current mirror circuit of the transistors M101 and M107.

Therefore, in order to increase the load drive capability by increasing the maximum output sink current at the output terminal OUT, it is necessary to increase the output current of the current source I101 and further to increase the bias current of the circuit.

Figure 2:
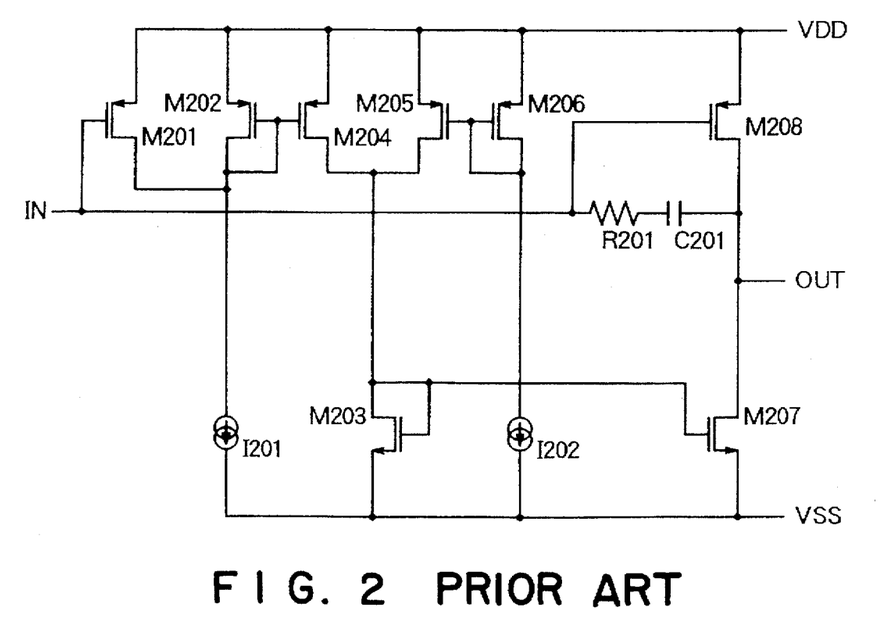
FIG. 2 is a circuit diagram showing another conventional operational amplifier.

FIG. 2 shows another conventional amplifier disclosed by U.S. Pat. No. 4,529,948. In this circuit, the maximum drain current of an output transistor M207 to which flows a sink current from a load (not shown) connected the circuit is decided by two output currents of constant current sources I201 and I202. Because the transistor M207 is connected to the constant current sources I201 and I202 through a current mirror circuit of transistors M207 and M203, a current mirror circuit of transistors M202 and M204, and a current mirror circuit of transistors M205 and M206.

In this amplifier circuit, in order to increase the load drive capability by increasing the maximum output sink current at the output terminal OUT, it is necessary to increase the output currents of the current sources I201 and I202 and to increase the bias current of the circuit.

Figure 3:
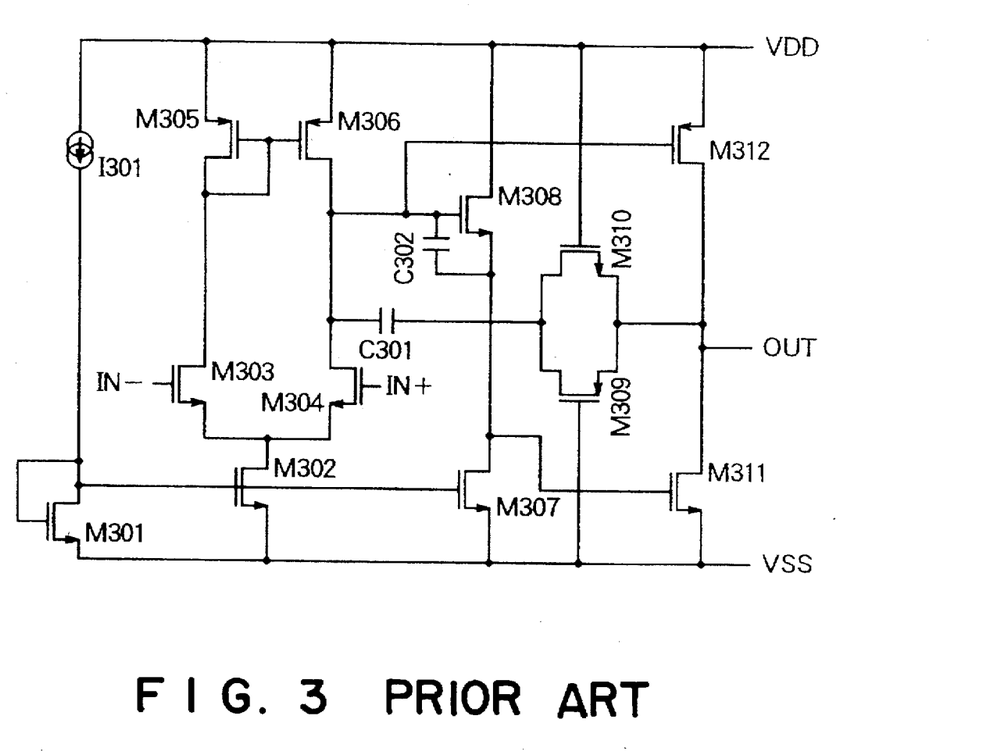
FIG. 3 is a circuit diagram showing a still another conventional operational amplifier.

FIG. 3 shows still another conventional amplifier disclosed by U.S. Pat. No. 4,284,957. In this circuit, a constant current source I301 and three transistors M301, M302, and M307 constructing a current mirror circuit provide a constant current of the circuit. Five transistors M302 to M306 construct a differential amplifier circuit. A transistor M308, a speed-up capacitor C302 and a transistor M307 construct a level shift circuit. Further, a capacitor C301 and two transistors M309 and M310 construct a phase compensating circuit. And, two transistors M311 and M312 construct an output circuit. The gate of the transistor M312 is connected to the source of the transistor M306, and the gate of the transistor M311 is connected to the drain of the transistor M308.

In this circuit, a sink current that flows from a load circuit (not shown) to the output circuit is decided by a gate voltage of the transistor M311. This gate voltage of the transistor M311 is decided by a gate voltage of the transistor M308. And, the gate voltage of the transistor M308 is an output of the differential amplifier circuit.

Suppose that the differential amplifier circuit operates under the ideal condition. When two input voltages IN+ and IN− are equal to each other (the input differential voltage is zero), an output voltage obtained at the drain node of the transistor M306 becomes equal to the drain of the transistor M305.

The gate and the drain of the transistor M305 are connected to each other. The drain voltage of the transistor M305 thus becomes a voltage obtained by subtracting a gate-source voltage Vgs from a supply voltage VDD. Therefore, the gate voltage of the transistor M311 is dependent upon the supply voltage VDD. Further, the bias currents of the two output transistors M311 and M312 are dependent upon the supply voltage VDD, with the result that the current consumption of the output transistors depends largely upon the supply voltage VDD. Further, when the threshold voltage Vth of the transistor M311 changes, its gate voltage and Vgs-Ids characteristics (the gate-source voltage v.s. the source-drain current) both change. Therefore, the bias currents of the two output transistors M311 and M312 change largely, so that their current consumption also changes largely.

As described above, in the conventional operational amplifiers as shown in FIGS. 1 and 2, in order to obtain a large sink current, since the normal current supplied from the constant current source must be increased, the current consumption increases undesirably. And, in the conventional operational amplifier as shown in FIG. 3, the bias currents of the output transistors change undesirably due to the influence of the supply voltage. Further, in the conventional operational amplifier, since no current flows to or from the output terminal, the current consumption increases in the steady state in which the potential at the output terminal is about the middle point of the supply voltage.

SUMMARY OF THE INVENTION

Accordingly, it is the object of the present invention to provide an output circuit which can increase the maximum output current as largely as possible, decrease the current consumption, and stabilize the bias current in the steady state.

To achieve the above-mentioned object, the present invention provides an output circuit, comprising: a constant voltage source; a first transistor of a first-conductivity type having a gate connected to said constant voltage source; a second transistor of a second-conductivity type having a source connected to a source of said first transistor and a gate connected to a circuit input terminal; a third transistor of the first-conductivity type having a drain connected to a circuit output terminal and a gate connected to the circuit input terminal; a current-current converter circuit for outputting a current proportional to a drain current of said second transistor to the circuit output terminal; and voltage supplying means for supplying an output voltage to and operating said first to third transistors and said current-current converter circuit, wherein an output current of said current-current converter circuit and a drain current of said third transistor in a steady state are determined according to the output voltage of the constant voltage source.

The output circuit may further include a level shift circuit connected between at least any one of gates of the second and third transistors and the circuit input terminal.

The constant voltage source may include a series circuit including at least a constant current source and fourth to sixth diode-connected transistors.

The output circuit may further include a phase compensation circuit connected between the circuit input terminal and the circuit output circuit.

An output voltage of a differential amplifier circuit may be applied to the circuit input terminal of the output circuit.

The present invention further provide an output circuit, comprising: a constant voltage source; a differential amplifier having an inverting input terminal connected to the constant voltage source; a first transistor of a first-conductivity type having a source connected to a non-inverting input terminal of the differential amplifier a gate connected to a circuit input terminal; a second transistor of a second-conductivity type that is opposite to the first-conductivity type, having a drain connected to a circuit output terminal and a gate connected to the circuit input terminal; a third transistor of the first-conductivity type having a gate connected to an output terminal of the differential amplifier and drain connected to the source of the first transistor; and a fourth transistor of the first-conductivity type having a gate connected the gate of the third transistor and a drain connected to the circuit output terminal, wherein drain currents of the second and fourth transistors in a steady state are determined according to an output voltage of the constant voltage source.

DETAILED DESCRIPTION OF THE PREFERRED EMBODIMENTS

Preferred embodiments of the output circuit according to the present invention will be described hereinbelow with reference to the attached drawings.

Figure 4:
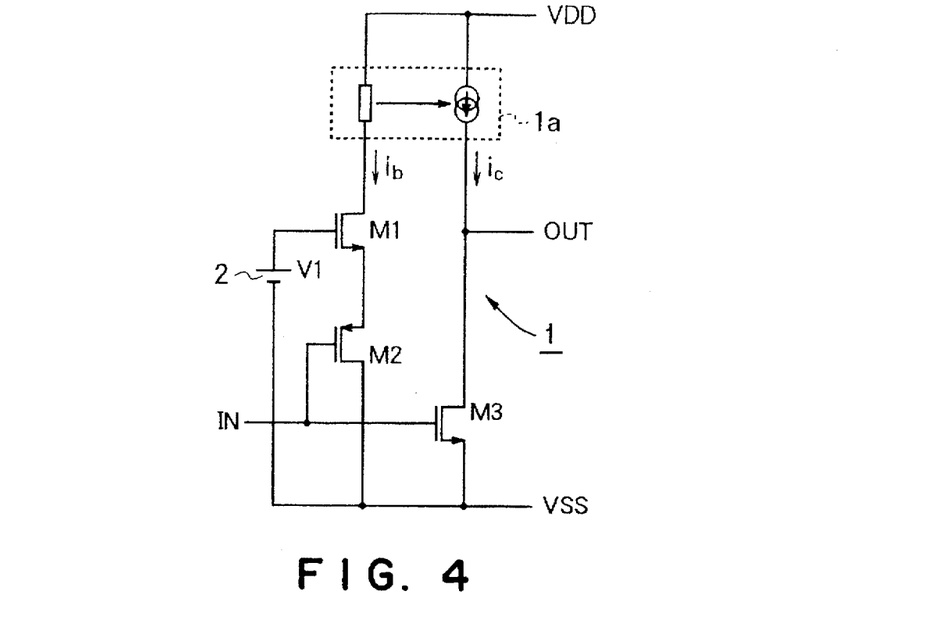
FIG. 4 is a circuit diagram showing a first embodiment of the output circuit according to the present invention.

FIG. 4 is a first embodiment of the output circuit according to the present invention. In the drawing, an output circuit 1 is provided with of an NMOS transistor M1, a PMOS transistor M2, an NMOS transistor M3, and a current-current converter circuit 1a. Further, a constant voltage source 2 is connected to the gate of the transistor M1 to apply a gate (reference) voltage V1 thereto.

The source of the NMOS transistor M1 is connected to the source of the PMOS transistor M2. The drain of the transistor M1 is connected to a first voltage supply for supplying a supply voltage VDD via the current-current converter circuit 1a. The drain of the transistor M2 is connected to a second voltage supply for supplying a supply voltage VSS. The gate of the transistor M1 is connected to the second voltage supply (VSS) via the constant voltage source 2 for applying a predetermined reference voltage V1 (described later). The gate of the transistor M2 is connected to an input terminal IN. Further, the drain of the NMOS transistor M3 is connected to the first voltage supply (VDD) via an output terminal OUT and the current-current converter circuit 1a. The source of the transistor M3 is connected to the second voltage supply (VSS), and its gate is connected to the input terminal IN.

A current flows through the current-current converter circuit 1a at its one terminal. The current is proportional to another current flowing through the other terminal. A current mirror circuit (described later) is adopted as the current-current converter circuit 1a.

The operation of the circuit shown in FIG. 4 will be described hereinbelow. In the output circuit, the transistor M1 is of common (or grounded)-gate type, and the transistor M2 is of source-follower type. The common-gate transistor M1 operates on the basis of a gate bias voltage V1. The source potential of the transistor M1 becomes a constant voltage determined by (V1–Vgs1). Here, Vgs1 denotes the gate-source voltage of the transistor M1. On the other hand, the drain current of the source-follower transistor M2 is decided by its gate-source voltage Vds2 (=V1–Vgs1–IN). The drain current of the transistor M2 becomes the drain current of the transistor M1, and further becomes one of the currents that flow through the current-current converter circuit 1a. In the circuit, that is, in the series-connected circuit of the common-gate transistor M1 and the source-follower transistor M2, there exists such an advantage that the current that flows through the series circuit will not change according to the supply voltage and the transistor characteristics.

In operation, the input signal given to the input terminal IN is applied to the gates of the transistor M2 and M3. Here, when the voltage level of the input signal increases, the drain current of the NMOS transistor M3 increases, while the drain current of the PMOS transistor M2 decreases. The drain current of the PMOS transistor M2 is a current ib flowing through one terminal of the current-current converter circuit 1a. When the drain current of the transistor M2 decreases, the current ic flowing through the other terminal of the current-current converter circuit 1a also decreases in proportion to the current ib.

As a result, when the input voltage increases, a differential current between the increased drain current of the transistor M3 and the decreased current ic is output via the output terminal OUT. In the same way, when the input voltage decreases, a differential current between the decreased drain current of the transistor M3 and the increased current ic is output via the output terminal OUT.

Suppose that the voltage at the output terminal OUT is in an equilibrium condition; that is, the input signal is not applied to the input terminal IN. No current flows from the output terminal OUT to a load (not shown) or vice versa. And the output terminal OUT is at roughly an intermediate voltage between the two supply voltages VDD and VSS. This results in the drain current of the transistor M3 being equal to the output current (bias current) ic of the current-current converter circuit 1a. Under these conditions, the drain current of the transistor M3 is kept at a constant value. Because a voltage obtained by subtracting two gate-source voltages (Vgs1+Vgs2) of the transistors M1 and M2 from the reference voltage V1 of the constant voltage source 2 is applied to the gate of the transistor M3.

The output current Ic is proportional to the drain current of the transistor M2 via the current-current converter circuit 1a. Further, as already explained, the drain current of the transistor M2 is decided on the basis of such relationship that a voltage difference between the reference voltage V1 and the voltage at the input terminal IN is an addition of the gate-source voltages of the two transistors M1 and M2.

Accordingly, in the steady state, it is possible to set the two drain currents of the transistor M2 and M3 on the basis of the reference voltage V1. It is thus possible to allow the output current ic of the current-current converter circuit 1a to be equal to the drain current of the transistor M3 in the steady state by appropriately determining the current conversion ratio.

Figure 5:
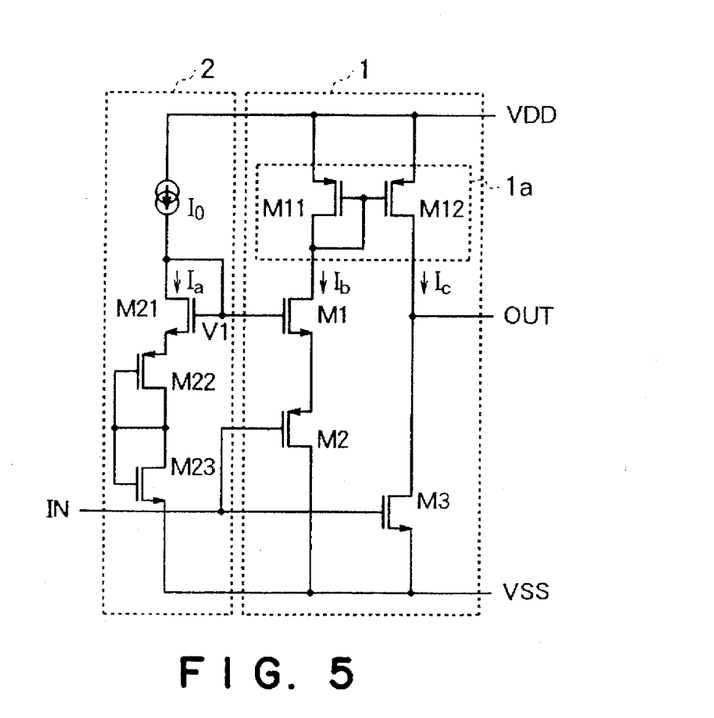
FIG. 5 is a circuit diagram showing a more practical construction of the circuit shown in FIG. 4.

FIG. 5 shows a practical example of the current-current converter circuit 1a and the constant voltage source 2 of the output circuit 1 shown in FIG. 4. In FIG. 5, the same reference numerals have been retained for similar parts or elements having the same function as with the case of the output circuit shown in FIG. 4, without repeating any similar description thereof.

The current-current converter circuit 1a is constructed by a current mirror circuit of two PMOS transistors M11 and M12. The output current ratio of the current mirror circuit can be set to an appropriate value by determining the area ratio of the two transistors M11 and M12.

The constant voltage source 2 is a series circuit of a constant current source I0, an NMOS transistor M21, a PMOS transistor M22 and an NMOS transistor M23. Further, two supply voltages VDD and VSS are applied to both the ends of the series circuit. These three transistors M21 to M23 are diode-connected to each other. Therefore, the gate voltage V1 of the transistor M1 can be obtained by driving the diode-connected transistors M21 to M23 by the current source I0. The circuit construction other than the above is the same as with the circuit shown in FIG. 4.

The operation related to the sink current of the output circuit 1 provided with the constant voltage source 2 will be explained hereinbelow.

The following condition will be considered:

The two drain currents of the transistors M3 and M12 will be equal to each other (i.e., the sink current is zero) when the voltage at the output terminal OUT is in an equilibrium state (at an intermediate voltage between the supply voltages VDD and VSS).

As already explained, the drain current of the transistor M3 can be determined by the voltage at the input terminal IN in the steady state, that is, by a gate-source voltage Vgs3 of the transistor M3. The drain current Ic of the transistor M12 is proportional to the drain current Ib of the transistor M2 that flows through the transistor M11. Further, the drain current Ib of the transistor M2 is decided by the gate-source voltage Vgs2 of the transistor M2.

Further, the gate-source voltage Vgs2 is decided by the reference voltage V1 of the constant voltage source 2, the gate-source voltage Vgs1 of the transistor M1, and the voltage at the input terminal IN. Here, it is possible to set the current Ib proportional to the output current Ia as the drain current of the transistor M2. Because the output voltage V1 of the constant voltage source 2 can be set by the output current Ia of the current source I0.

This point will be described in further detail hereinbelow. In a circuit loop of the circuit shown in FIG. 5: supply voltage VSS→transistor M3→transistor M2→transistor M1→V1→transistor M21→transistor M22→transistor M23→supply voltage VSS, the following relationship can be established:

$$Vgs3+Vgs2+Vgs1=Vgs2+Vgs22+Vgs23=V1$$

Here, Vgs21, Vgs22, and Vgs23 denote the gate-source voltages of the transistors M21, M22, and M23, respectively.

For brevity, suppose that the mirror current ratio is 1:1 (the case of [1:m] will be described later) and the transistor characteristics are the same in both the transistors M1 and M21, in both the transistors M2 and M22, and in both the transistors M3 and M23, respectively. Since the circuit is symmetrical, the drain current of the transistor M1 is equal to that current of the transistor M21, and further the drain current of the transistor M2 is equal to the drain current of the transistor M22. Further, the drain currents of the transistors M22 and M23 are common with each other, which is equal to the output current Ia of the current source I0. As a result, the drain currents of the transistors M3 and M12 are equal to each other in the steady state.

In the circuit construction as described above, it is possible to freely set the two bias currents Ib and Ic in the steady state of the output circuit 1 on the basis of the current source I0. In addition, this output circuit 1 is not susceptible to change in the transistor characteristics and the supply voltage.

Figure 6:
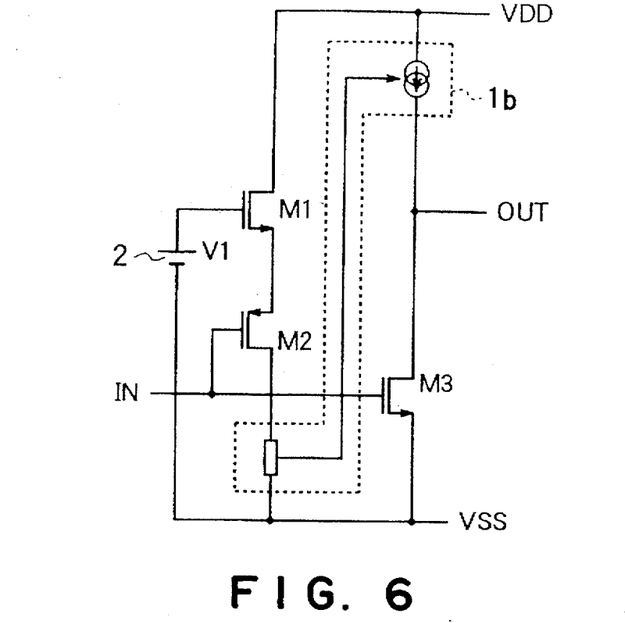
FIG. 6 is a circuit diagram showing a second embodiment of the output circuit according to the present invention.

FIG. 6 shows a second embodiment of the output circuit according to the present invention. In FIG. 6, the same reference numerals have been retained for similar parts or elements having the same function as with the case of the first embodiment shown in FIG. 4 without repeating any similar description thereof.

This second embodiment is different from the first embodiment in that the current detecting section of a current-current converter circuit 1b is connected between the drain of the transistor M2 and the second voltage supply (VSS), and the current output section of the second circuit 1b is connected between the first voltage supply (VDD) and the output terminal OUT. The circuit construction other than the above is the same as with the case of the first embodiment shown in FIG. 4.

Figure 7:
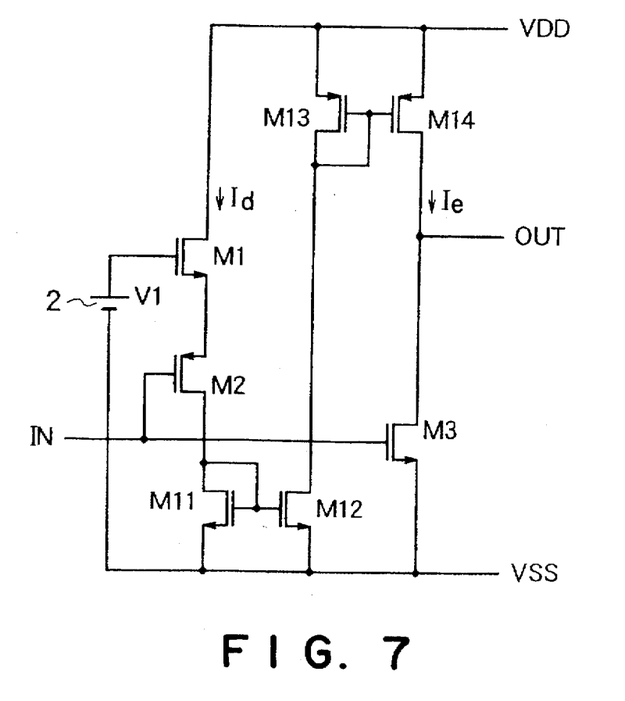
FIG. 7 is a circuit diagram showing a more practical construction of the circuit shown in FIG. 6.

FIG. 7 shows a practical example of the current-current converter circuit 1b shown in FIG. 6. The current-current converter circuit 1b is constructed by two current mirror circuits of transistors M11 and M12, and transistors M13 and M14. In this circuit construction, the drain current of the transistor M2 is equal to the drain current Id of the transistor M11; which is proportional to the drain current of the transistor M12; which is equal to the drain current of the transistor M13; and which is proportional to the drain current Ie of the transistor M14. Therefore, it is possible to obtain a relatively large current ratio between the drain current Id of the transistor M11 and the drain current Ie of the transistor M14.

In the circuit as described above, it is possible to set the drain current of the transistors M14 and M3 by the reference voltage V1 of the constant voltage source 2, that is, the current source I0 (shown in FIG. 5) of the constant voltage source 2.

Figure 8:
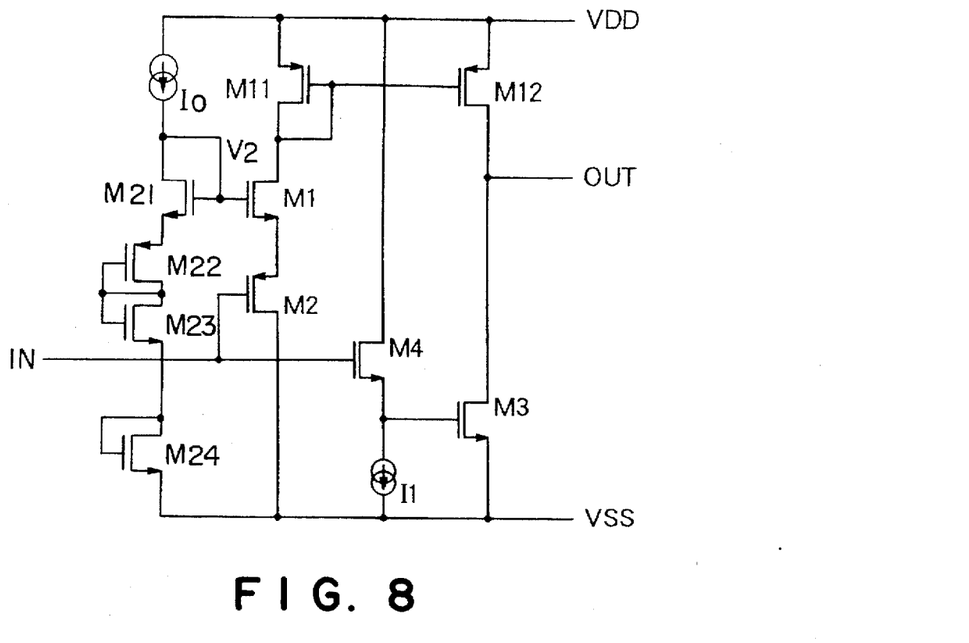
FIG. 8 is a circuit diagram showing a third embodiment of the output circuit according to the present invention, in which a level shift circuit is added to the first embodiment shown in FIG. 4.

FIG. 8 shows a third embodiment of the output circuit according to the present invention. In FIG. 8, the same reference numerals have been retained for similar parts or elements having the same function as with the case of the output circuit shown in FIG. 5, without repeating any similar description thereof.

This third embodiment is different from the circuit shown in FIG. 5 in that the voltage at the input terminal IN is set to a higher value by a level shift circuit. A signal with a large amplitude thus can be input to the input terminal IN.

In more detail, in this third embodiment, a level shift circuit of an NMOS transistor M4 and a current source I1 is connected between the gate of the transistor M3 and the input terminal IN. The voltage VIN of the input terminal IN is expressed as VIN=Vgs3+Vgs4. Here, Vgs3 and Vg4 denote the gate-source voltage of the transistors M3 and M4, respectively. Further, Vgs3=V2−Vgs1−Vgs2−Vgs4. Therefore, the voltage VIN at the input terminal IN rises due to a voltage drop of the added level shift circuit. In this case, a constant voltage source for outputting the voltage V2 can be constructed by a series circuit of a current source I0 and four diode-connected transistors M21 to M24. In this case, each pair of four transistor pairs M1 and M21; M2 and M22; M4 (the level shift transistor) and M23; and M3 and M24 is formed in such a way that the transistor characteristics of each pair are equal to each other.

Further, it is possible to obtain still a larger level shift rate (voltage drop rate) of the input signal applied to the input terminal IN. This is achieved by connecting a single or a plurality of series diode-connected transistors (not shown) between the gate of the transistor M3 and the source of the transistor M4. Further, it is also possible to select the number of the diode-connected transistors of the constant voltage source for outputting the voltage V2 according to the level shift rate.

Figure 9:
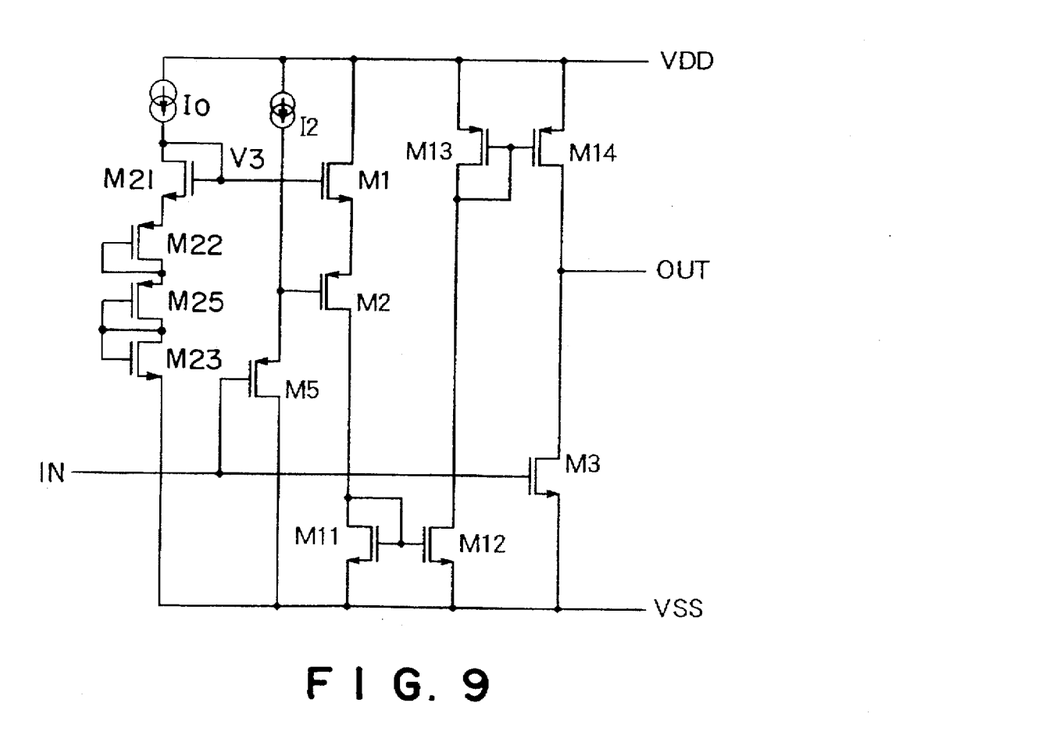
FIG. 9 is a circuit diagram showing a fourth embodiment of the output circuit according to the present invention, in which a level shift circuit is added to the second embodiment shown in FIG. 6.

FIG. 9 shows a fourth embodiment of the output circuit according to the present invention. In FIG. 9, the same reference numerals have been retained for similar parts or elements having the same function as with the case of the output circuit shown in FIG. 7, without repeating any similar description thereof.

This fourth embodiment is different from the circuit shown in FIG. 7 in that the gate and source voltages of the transistor M2 are set to relatively high values, to increase the drain-source voltage of the transistor M2.

That is, in this example, a level shift circuit of a PMOS transistor M5 and a current source I2 is connected between the gate of the transistor M2 and the input terminal IN. Then, the following relationships are established: V3−Vgs1=VIN+Vgs2+Vgs5 and Vgs2=V3 −Vgs1−Vgs5−VIN (=Vgs3). Here, VIN denotes the voltage of the input terminal IN, and Vgs1 to Vgs3 and Vgs5 denote the gate-source voltages of the transistors M1, M2, M3, and M5, respectively. Therefore, the drain-source voltage of the PMOS transistor M2 increases by a value corresponding to the voltage drop of the added level shift circuit. In this case, a constant voltage source for outputting the voltage V3 can be constructed by a series circuit of a current source I0 and four diode-connected transistors M21 to M23, and M25. In this case, each pair of four transistor pairs M1 and M21; M2 and M22; M5 (the level shift transistor) and M25; and M3 and M23 is formed in such a way that the transistor characteristics of each pair are equal to each other.

Further, it is possible to obtain still a larger level shift rate (voltage drop rate). This is achieved by connecting a single or a plurality of series diode-connected transistors (not shown) between the gate of the transistor M2 and the source of the transistor M5. Further, it is also possible to select the number of the diode-connected transistors of the constant voltage source for outputting the voltages according to the level shift rate.

As described above with reference to FIGS. 8 and 9, it is possible to construct the output circuit in such a way that the input signal is applied to the gate of the transistor M2 or M3 via a level shift circuit. Further, it is also possible to construct the output circuit in such a way that the input signal is applied to both the gates of the transistors M2 and M3 via a level shift circuit, respectively.

Figure 10:
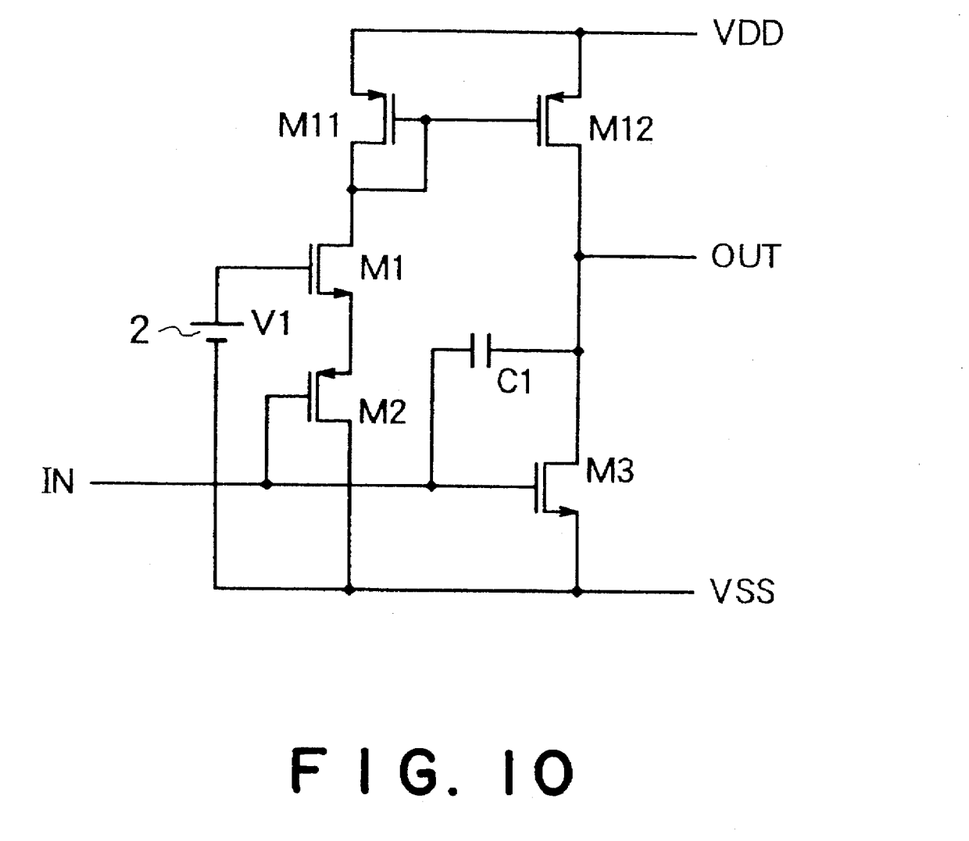
FIG. 10 is a circuit diagram showing a fifth embodiment of the output circuit according to the present invention, in which a phase compensation circuit is added to the first embodiment shown in FIG. 4.

FIG. 10 shows a fifth embodiment of the output circuit according to the present invention. In FIG. 10, the same reference numerals have been retained for similar parts or elements having the same function as with the case of the output circuit shown in FIG. 5, without repeating any similar description thereof.

This fifth embodiment is different from the circuit shown in FIG. 5 in that a phase-compensation capacitor C1 is connected between the gate and the drain of the transistor M3 (between the input and output terminals IN and OUT). The operation of this fifth embodiment is the same as that of the circuit shown in FIG. 5.

Figure 11:
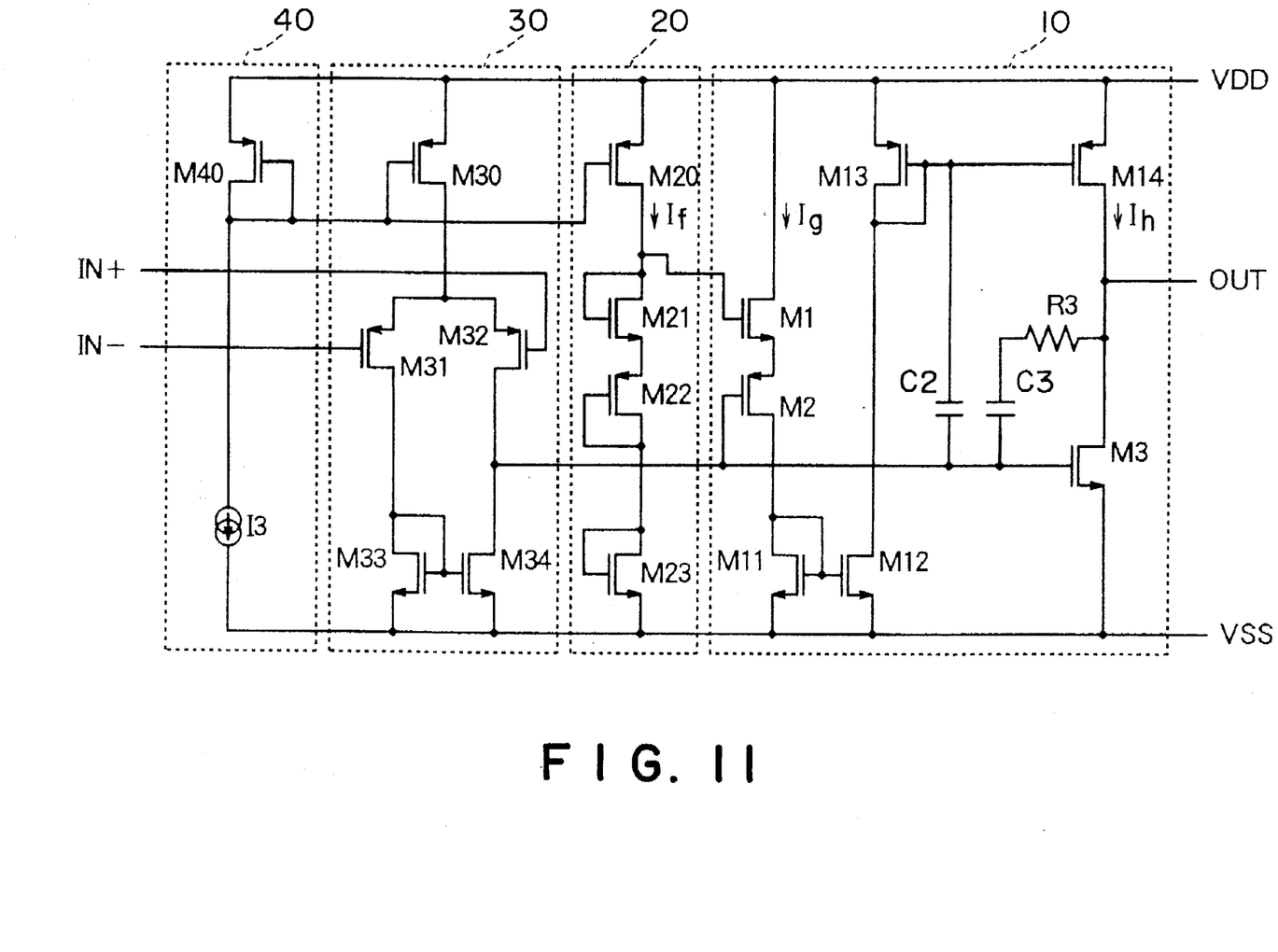
FIG. 11 is a circuit diagram showing a sixth embodiment of the output circuit according to the present invention.

FIG. 11 shows a sixth embodiment according to the present invention. The circuit is provided with an output circuit 10, a reference voltage generating circuit 20, a differential amplifier circuit 30, and a constant current source bias circuit 40.

The output circuit 10 includes an NMOS transistor M1, a PMOS transistor M2, a transistor M3, and a current mirror circuit made up of transistors M11 to M14, a capacitor C2 for phase-compensating for the transistor M14; and a capacitor C3 and a resistor R3 for phase-compensating for the transistor M3.

The reference voltage generating circuit 20 includes a PMOS transistor M20, an NMOS transistor M21, a PMOS transistor M22, and an NMOS transistor M23. The transistors M21 to M23 are diode-connected to each other to form a series-connected circuit. A current is supplied from the transistor M20 to this series-connected circuit to apply a predetermined voltage (from the ground level VSS) to the drain of the transistor M21. The output current of the constant current transistor M20 is controlled by the constant current source bias circuit 40.

The differential amplifier circuit 30 includes a differential transistor pair having PMOS transistors M31 and M32, a PMOS transistor M30 for supplying a constant current to the common source of the differential transistor pair M31 and M32, and a current mirror circuit made up of transistors M33 and M34 each drain of which is connected to the corresponding drain of the differential transistor pair. Both the gates of the differential transistor pair M31 and M32 are two input terminals of the differential amplifier circuit 30, to which two input signals IN+ and IN− changing complementarily are applied. Further, the drain of the transistor M32 or that of the transistor M34 is an output terminal OUT of the differential amplifier circuit 30. This output terminal OUT is connected to the gates of the transistor M2 and M3.

The constant current bias current 40 includes a transistor M40 and a current source I3. The transistor M40 and the transistors M20 and M30 construct a current mirror circuit. Therefore, a current proportional to the drain current of the transistor M40, that is the current of the current source I3, is output from the two transistors M20 and M30 operating as a constant current source, respectively.

When the above-mentioned circuit is actually formed as a semiconductor integrated circuit, for example, the size (ratio) of each transistor is determined under consideration of the output current and the current consumption. Here, an example of the operational amplifier circuit formed under consideration of the transistor size ratio will be described hereinbelow in more detail.

In the case of the steady state (no current flows from the output terminal OUT and thereby the voltage at the output terminal OUT lies at an intermediate point between the two supply voltages VDD and VSS), the operating point of the above-mentioned circuit can be decided so as to satisfy the following two conditions:

In a circuit loop as: voltage supply VSS→transistor M3→transistor M2→transistor M1→transistor M21→transistor M22→transistor M23→voltage supply VSS, the following relationship can be established $$Vgs1+Vgs2+Vgs3=Vgs21+Vgs22+Vgs23 \quad (1)$$

$$Id14=Id3 \quad (2)$$

where Id3 and Id14 denote the drain currents of the transistors M3 and M14, respectively.

Further, when the operating point of the circuit lies in a pentode region, the drain current Id of a MOS transistor is ti $Id=(1/2) \times kp \times (W/L) \ (Vgs-Vth)^2$ where kp denotes a constant decided according to manufacturing process; W denotes the gate width of the transistor; L denotes the gate length thereof; and Vth denotes the threshold voltage thereof. Therefore, when the gate-source voltage (Vgs) is equal to each other, the drain current Id of the transistor is proportional to the transistor size (W/L). Therefore, the transistor size ratio is set as follows:

transistor M40:transistor M20=1:i
transistor M21:transistor M1=1:j
transistor M22:transistor M2=1:k
transistor M23:transistor M3=1:l
transistor M11:transistor M12=1:m
transistor M13:transistor M14=1:n where i to n is a positive real number, respectively. Further, If denotes the drain currents of the transistors M20 to M23; Ig denotes the drain currents of the transistors M1, M2 and M11; and Ih denotes the drain currents of the transistors M14 and M3.

Then, the current ratio of the current mirror circuit of the transistors M11 to M14, that is, the drain current ratio of the transistor M11 to the transistor M14 is 1: (m×n). Therefore, the above expression (2) can be expressed as $$Id1 \times (m \times n)=Id14$$

so that $$Ig \times (m \times n)=Ih \quad (3)$$

In the same way, $$If=I3 \times i \quad (4)$$

Under these conditions, a method of deciding the operating point in the steady state will be explained hereinbelow.

The simplest case where i=j=k=l=n=m=1 will be first described hereinbelow:

on condition of the expression (4) and i=1; If=I3
on condition of the expression (3) and m×n=1; Ig=Ih Therefore, in order to satisfy the expression (1), it is necessary that If=Ig=Ih. As a result, the bias currents Ig and Ih of the output circuit in the steady state are Ig=I3 and Ih=I3. That is, it can be understood that the bias current can be set by the current source I3.

Next, the case where i=j=1, 1=m×n will be described hereinbelow: on condition of the expression (3);

$$Ih=Ig \times (m \times n)=Ig \times 1$$

Therefore, in order to satisfy this condition, j=k=1, and the expression (1), it is necessary that If=Ig.

Further since If=I3×i, Ig=I3×i and Ih=I3×i×1.

As described above, it is possible to set the respective current values freely in the steady state, by setting the transistor sizes (ratios) of the reference voltage generating circuit (constant voltage source) 20 and the output circuit 10 appropriately.

Figure 12:
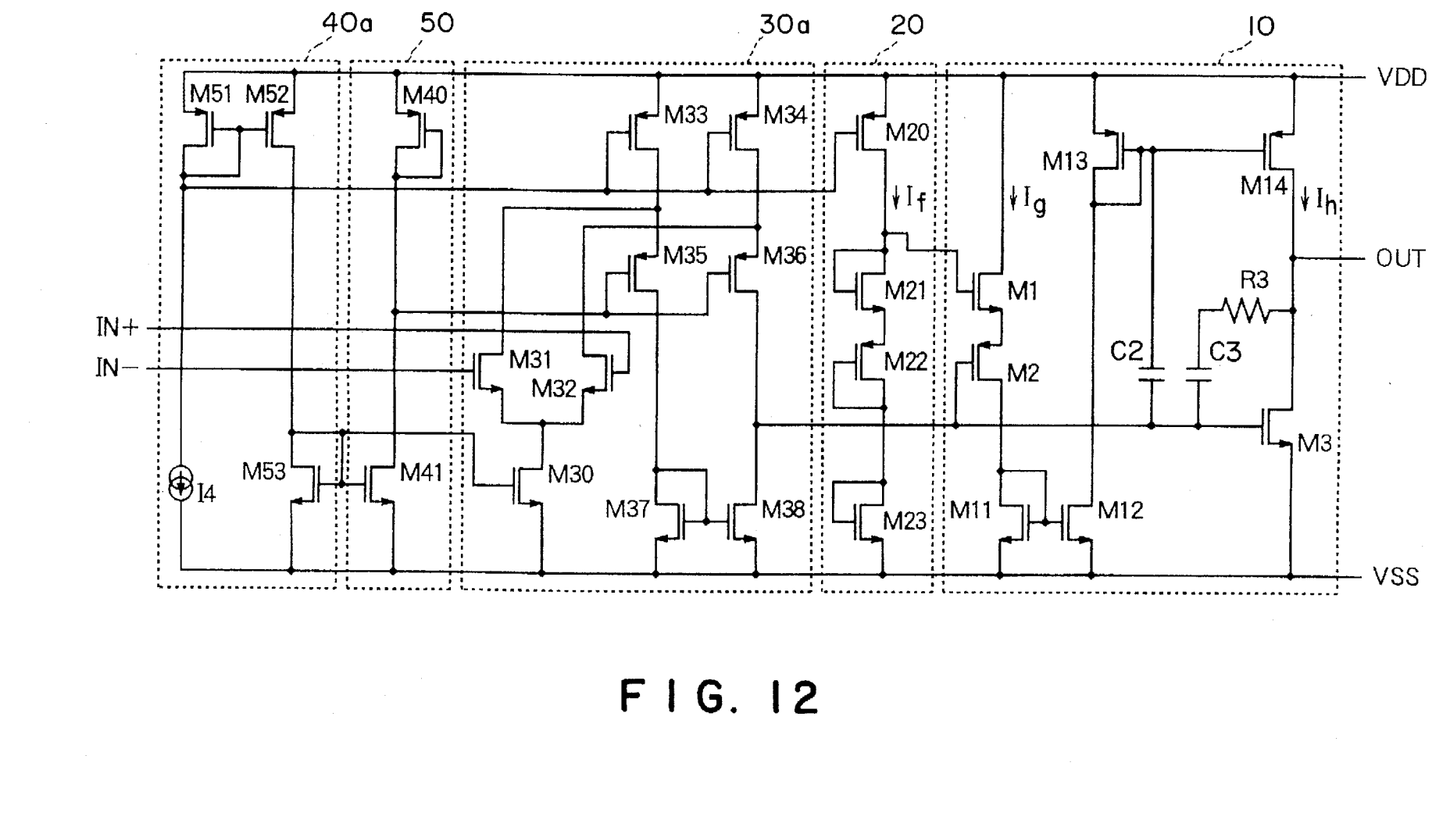
FIG. 12 is a circuit diagram showing a seventh embodiment of the output circuit according to the present invention.

FIG. 12 shows a seventh embodiment according to the present invention. In FIG. 12, the same reference numerals have been retained for similar parts or elements having the same function as with the case of the embodiment shown in FIG. 11, without repeating any similar description thereof.

The circuit shown in FIG. 12 is provided with an output circuit 10, a first reference voltage generating circuit 20, a differential amplifier circuit 30a, a constant current source bias circuit 40a, and a second reference voltage generating circuit 50. The output circuit 10 and the first reference voltage generating circuit 20 are the same as those shown in FIG. 11. However, the differential amplifier circuit 30a is of folded cascade circuit of nine transistors M30 to M38.

In more detail, the differential amplifier circuit 30a includes the constant current source transistor M30 and a differential circuit made up of a differential transistor pair M31 and M32. A difference in voltage between two complementary outputs of the differential circuit is detected by a circuit of the six transistors M33 to M38. A constant voltage is applied to each gate of the transistors M35 and M36 from the second reference voltage generating circuit 50, to operate both the transistors in common gate mode. The drain of the PMOS transistor M36 (the same as the drain of the NMOS transistor M38) is an output terminal OUT of the differential amplifier circuit 30a, which is connected to the gates of the two transistors M2 and M3 of the output circuit 10.

In the circuit as shown in FIG. 12, there exists such an advantage that it is possible to obtain the output signal of a relatively high voltage amplitude level in spite of a relatively low supply voltage.

The second reference voltage generating circuit 50 includes two a diode-connected transistor M40 and an NMOS transistor M41. Here, the transistor M40 is a current source transistor.

The constant current source bias current 40a includes a current source I4 and a current mirror circuit of three transistors M51 to M53, which operates as a constant current source for driving four transistors M41, M33, M34 and M20.

In the circuit shown in FIG. 12, it is possible to set the area ratios of the transistors appropriately, in the same way as with the case of the circuit shown in FIG. 11. Further, it is also possible to set the bias currents If, Ig and Ih to any desired values, respectively on the basis of the current value of the current source I4.

Further, in the above description, the embodiment in which the current ratios of the current mirror circuit are set to [1:1] and [1:n (a positive real number)] has been explained with reference to the circuit shown in FIG. 11. Without being limited only thereto, however, the circuits are designed by setting each mirror current ratio to an appropriate value, in the circuits as shown in FIGS. 5, 7, 9, 11 and 12.

Figure 13:
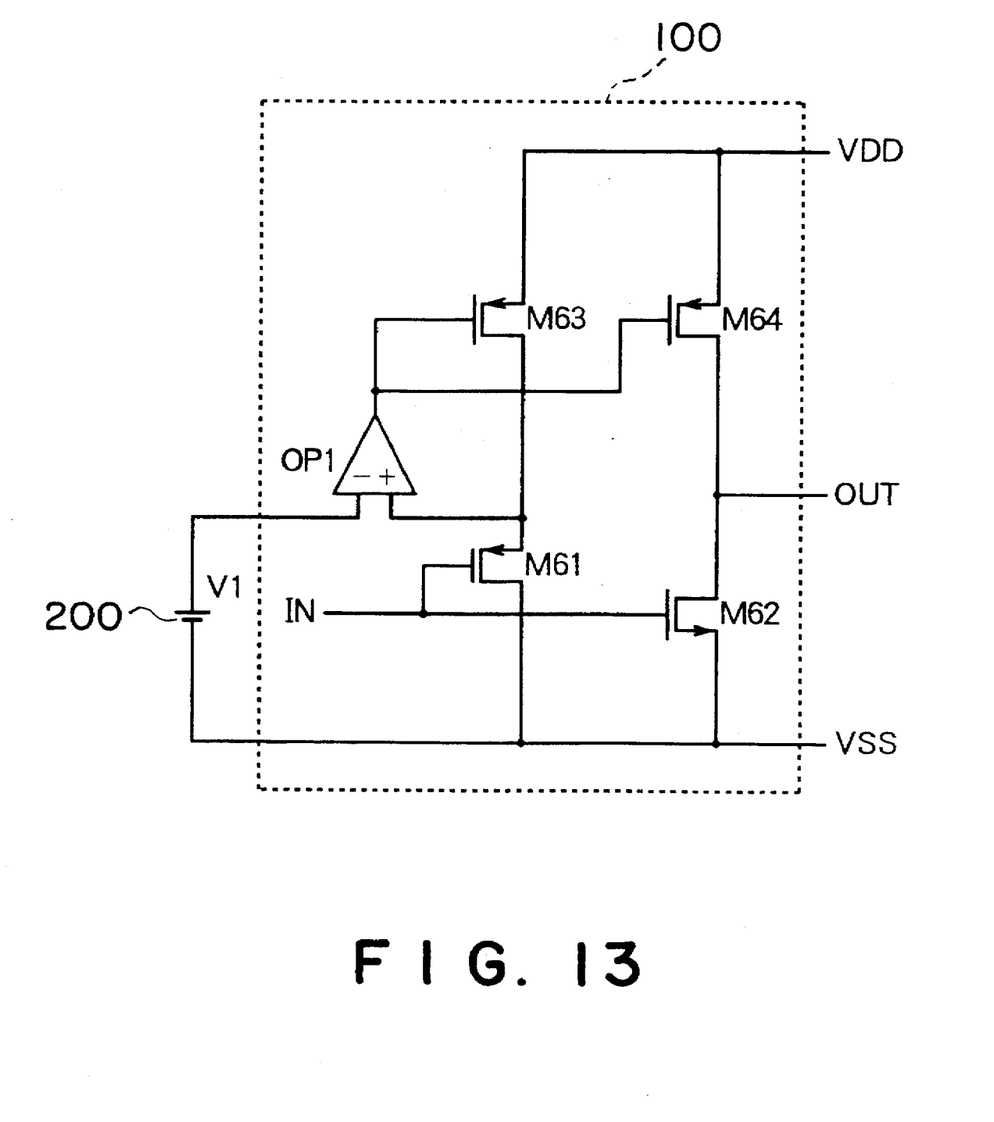
FIG. 13 is a circuit diagram showing an eighth embodiment of the output circuit according to the present invention.

FIG. 13 shows an eighth embodiment according to the present invention. In FIG. 13, an output circuit 100 is provided with a PMOS transistor M61, an NMOS transistor M62, PMOS transistors M63 and M64, and an operational amplifier OP1. A constant voltage source 200 is connected to the inverting terminal of the operational amplifier OP1. An input terminal IN is connected to each gate of the transistor M61 and the transistor M62. The source of the transistor M61 is connected to the non-inverting terminal of the operational amplifier OP1 and the drain of the transistor M63. The gate of the transistor M63 is connected to the output terminal of the operational amplifier OP1 and the gate of the transistor M64. The drains of the transistors M64 and M62 are connected to an output terminal OUT. The sources of the transistors M63 and M64 are connected to a first voltage supply for supplying a supplying voltage VDD. And, the drains of the transistors M61 and M62 are connected to a second voltage supply for supplying a supplying voltage VSS.

Figure 14:
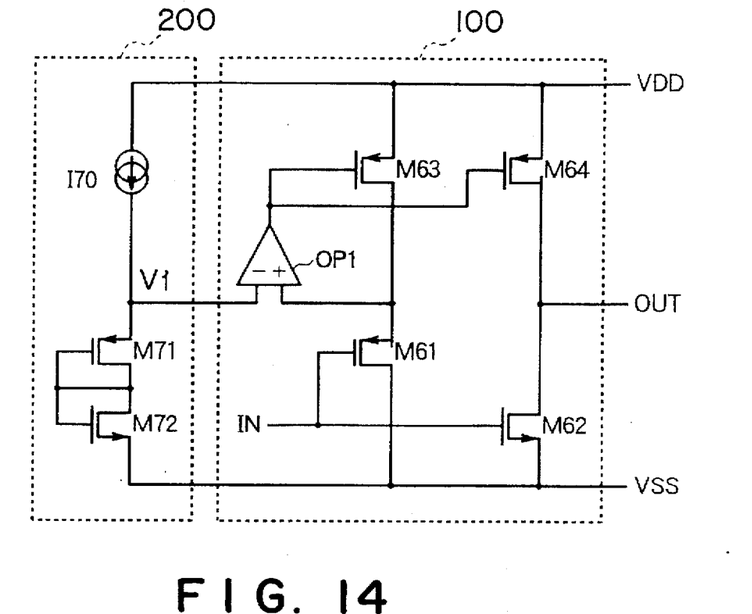
FIG. 14 is a circuit diagram showing a practical construction of a constant voltage source shown in FIG. 13.

The constant voltage source 200 is, as shown in FIG. 14, provided with a constant current source I70, and a series circuit of a PMOS transistor M71 whose drain and gate are connected to each other and an NMOS transistor M72 whose drain and gate are connected to each other. The same as described above, the transistors M71 and M61 are provided with almost the same transistor characteristics, and also are the transistors M72 and M62. The source potential of the transistor M71 becomes an output voltage V1 that is supplied to the inverting terminal of the operational amplifier OP1.

Figure 15:
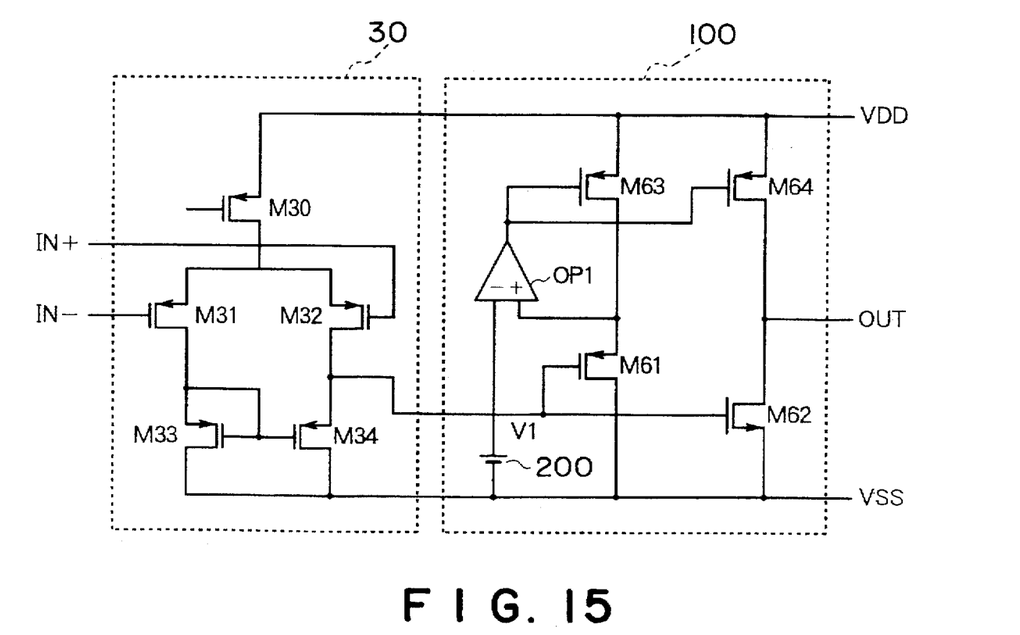
FIG. 15 is a circuit diagram showing a ninth embodiment of the output circuit according to the present invention, in which a differential amplifier is added to the eighth embodiment shown in FIG. 13.

FIG. 15 shows a ninth embodiment according to the present invention in which an output signal of a differential amplifier 30 is supplied to an output circuit 100. The differential amplifier 30 is the same as that shown in FIG. 11.

The operation of the output circuit 100 with the above operational amplifier OP1 will be described. A feed-back loop is formed as: output terminal of the operational amplifier OP1→transistor M63→non-inverting terminal of the operational amplifier OP1. The gate of the transistor M63 is so controlled with the feedback loop that an input voltage (source voltage of the transistor M61) of the non-inverting terminal of the operational amplifier OP1 becomes equal to an input voltage V1 of the inverting terminal of the operational amplifier OP1. The operational amplifier OP1 corresponds to the transistors M21 and M1 of the current mirror circuit as shown in FIG. 5. This correspondence provides a relationship that is similar to the relationships between the transistors M22 and 23, and also between transistors M2 and M3.

A negative feed-back by the operational amplifier OP1 with voltage drop of an input voltage at a input terminal IN increases a source current of transistor M61. This decreases a voltage at the non-inverting terminal of the operational amplifier OP1 to decrease a gate voltage of transistor M64 with a result of increase in its drain current. The voltage drop of the input voltage at the input terminal IN further decreases a gate voltage of transistor M62 with a result of decrease in its source current. A drain current of the transistor M64 is thus output via an output terminal OUT.

On the other hand, when the input voltage at the input terminal IN increases, the source current of the transistor M61 decreases. This increases the voltage at the non-inverting terminal of the operational amplifier OP1 to increase the gate voltage of the transistor M64 with a result of decrease in its drain current.

The voltage increase in the input voltage at the input terminal IN further decreases the gate voltage of the transistor M62 with a result of increase in its source current. Therefore, a current flows through the transistor M62 via the output terminal OUT.

When the output current is zero at the output terminal OUT, the bias current of the output circuit 100 is determined by the gate-source voltage versus drain current (Vgs–Id) characteristics of the transistors M61 and M62 and the output voltage V1 of the constant voltage source 200.

More in detail, the bias current of the output circuit 100 is determined as follows:

(1) The output voltage V1 of the constant current source 200 in FIG. 14 is obtained by V1=Vgs71+Vgs72. Here, Vgs71 and Vgs72 denote the gate-source voltages of the transistors M71 and M72, respectively. The output voltage V1 is thus determined by the gate-source voltage versus drain current (Vgs–Id) characteristics of the transistors M71 and M72 and the current value of the constant current source I70.

(2) Suppose that the transistors M71 and M61, and the transistors M72 and M62 are of the same size, respectively. In this case, the drain current of the transistor M63 becomes equal to the current of the constant current source I70 by the negative feed-back loop of the operational amplifier OP1, the transistor M63 as the constant current source, and the source follower transistor M61.

(3) The gate voltages of the transistors M63 and M64 are the same as each other. Further, the gate voltages of the transistors M61 and M62 are the same as each other. The bias currents of the transistors M62 and M64 are thus equal to the current of the constant current source I70. And, (4) Therefore, a stable bias current of the output circuit 100 is obtained by means of the constant current source I70.

The output circuits shown in FIGS. 13 to 15 are push-pull circuits. And, their bias current levels are easily chosen as described above to provide a larger maximum output current and better power efficiency.

Further, according to the constant voltage source 200 shown in FIGS. 13 to 15, the output voltage V1 is obtained by means of the transistors M71 and M72. The output circuits shown in FIG. 13 to 15 can operate by a supplied voltage lower than that in the output circuits shown in FIG. 4 and 5 with the transistors M1 to M3 and voltage V1.

As described above, in the output circuit according to the present invention, since the generation of the sink current can be suppressed in the steady state, it is possible to reduce the current consumption. In addition, the bias currents (Ia, Ib, and Ic) of the output circuit can be set easily by setting the current source (I0) of the reference voltage generating circuit or the current sources (I3 and I4) of the constant current source bias circuit. Further, even if the transistor characteristics and the supply voltage fluctuate, as far as the equilibrium condition thereof can be maintained, the sink current can be suppressed. In addition, the current generated by a circuit of a source-follower circuit (the transistor M2) and a common-gate circuit (the transistor M1) will not vary easily according to fluctuations in the current source voltage and changes in the transistor characteristics. It is thus possible to prevent the bias current from being consumed due to change in the circuit conditions.

As described above, in the output circuit according to the present invention, it is possible to suppress the sink current in the steady state and further to set the bias current level of the output circuit easily. As a result, the maximum output current to be supplied to the load can be increased, and further the current consumption of the load can be reduced in the steady state.

What is claimed is:

1. An output circuit, comprising:

a constant voltage source;

a first transistor of a first-conductivity type having a gate connected to said constant voltage source;

a second transistor of a second-conductivity type having a source connected to a source of said first transistor and a gate connected to a circuit input terminal;

a third transistor of the first-conductivity type having a drain connected to a circuit output terminal and a gate connected to the circuit input terminal;

a current-current converter circuit having first and second current mirror circuits, the first current mirror circuit including fourth and fifth transistors, each of the fourth and the fifth transistors being of the first-conductivity type, a drain and a gate of the fourth transistor and a gate of the fifth transistor being connected to a drain of the second transistor, the second current mirror circuit including sixth and seventh transistors, each of the sixth and the seventh transistors being of the second-conductivity type, a drain and a gate of the sixth transistor and a gate of the seventh transistor being connected to a drain of the fifth transistor, a drain of the seventh transistor being connected to the circuit output terminal, said current-current converter circuit outputting a current proportional to a drain current of said second transistor to the circuit output terminal; and voltage supplying means for supplying an output voltage to and operating said first to third transistors and said current-current converter circuit, wherein the output current of said current-current converter circuit and a drain current of said third transistor in a steady state are determined according to an output voltage of the constant voltage source.

2. The output circuit of claim 1, further comprising a level shift circuit connected between at least any one of gates of the second and third transistors and the circuit input terminal.

3. The output circuit of claim 1, wherein the constant voltage source includes a series circuit including at least a constant current source and eighth to tenth diode-connected transistors.

4. The output circuit of claim 2, wherein the constant voltage source includes a series circuit having a constant current source, eighth to eleventh diode-connected transistors adjusted in accordance with a voltage drop corresponding to a level shift rate of the level shift circuit.

5. The output circuit of claim 3, wherein the first to third transistors are so formed as to be substantially equal to the fourth to sixth transistors, respectively, with respect to electrical characteristics, and the drain currents of the second and third transistors can be determined by the constant voltage source.

6. The output circuit of claim 4, wherein the first to third transistors are so formed as to be substantially equal to the eighth to tenth transistors, respectively, with respect to electrical characteristics, and the drain currents of the second and third transistors can be determined by the constant voltage source.

7. The output circuit of claim 3, wherein a transistor area ratio of each of transistor pairs of the first and eighth transistors, the second and ninth transistors, and the third and tenth transistors is so determined that the drain current of the third transistor is substantially equal to the output current of the current-current converter circuit in the steady state, and larger than the drain current of the second transistor.

8. The output circuit of claim 4, wherein a transistor area ratio of each of transistor pairs of the first and eighth transistors, the second and ninth transistors, and the third and tenth transistors is so determined that the drain current of the third transistor is substantially equal to the output current of the current-current converter circuit in the steady state, and larger than the drain current of the second transistor.

9. The output circuit of claim 1, further comprising a phase compensation circuit connected between the circuit input terminal and the circuit output terminal.

10. The output circuit of claim 1, wherein an output voltage of a differential amplifier circuit is applied to the circuit input terminal of the output circuit.

* * * * *